(12) United States Patent
Matsubara et al.

(10) Patent No.: US 10,707,360 B2
(45) Date of Patent: Jul. 7, 2020

(54) THERMOSETTING ELECTROCONDUCTIVE PASTE COMPOSITION, AND SOLAR CELL AND SOLAR CELL MODULE BOTH USING THE SAME

(71) Applicant: KYOTO ELEX CO., LTD., Kyoto-shi, Kyoto (JP)

(72) Inventors: Toyoharu Matsubara, Kyoto (JP); Satoru Tomekawa, Kyoto (JP); Takamitsu Arai, Kyoto (JP); Yuta Motohisa, Kyoto (JP); Kimika Gotou, Kyoto (JP)

(73) Assignee: KYOTO ELEX CO., LTD., Kyoto-Shi (JP)

( * ) Notice: Subject to any disclaimer, the term of this patent is extended or adjusted under 35 U.S.C. 154(b) by 51 days.

(21) Appl. No.: 16/027,046

(22) Filed: Jul. 3, 2018

(65) Prior Publication Data

US 2019/0013422 A1 Jan. 10, 2019

(30) Foreign Application Priority Data

Jul. 4, 2017 (JP) ................................ 2017-131354

(51) Int. Cl.
| | |
|---|---|
| *H01B 1/22* | (2006.01) |
| *H01L 31/00* | (2006.01) |
| *H01L 31/0224* | (2006.01) |
| *H01L 31/18* | (2006.01) |
| *H01L 31/0216* | (2014.01) |
| *H01L 31/068* | (2012.01) |

(52) U.S. Cl.
CPC ....... *H01L 31/022425* (2013.01); *H01B 1/22* (2013.01); *H01L 31/02167* (2013.01); *H01L 31/068* (2013.01); *H01L 31/1884* (2013.01)

(58) Field of Classification Search
CPC .... H01B 1/00; H01B 1/22; C09D 5/25; H01L 31/0224; H01L 35/24
See application file for complete search history.

(56) References Cited

U.S. PATENT DOCUMENTS

| | | | | |
|---|---|---|---|---|
| 5,080,686 | A  * | 1/1992 | Garrecht | ............... C10L 1/1883 44/351 |
| 2015/0175817 | A1* | 6/2015 | Fukaya | ................ C09D 163/00 252/514 |

FOREIGN PATENT DOCUMENTS

JP 2016-131070 A 7/2016

* cited by examiner

*Primary Examiner* — Mark Kopec
(74) *Attorney, Agent, or Firm* — Birch, Stewart, Kolasch & Birch, LLP

(57) ABSTRACT

A thermosetting electroconductive paste composition includes an electroconductive powder (A) containing at least one of a silver-coated metal powder (A-1) and a powder of either copper or an alloy thereof (A-2), a thermosetting ingredient (B) containing at least one of an epoxy resin (B-1) and a blocked polyisocyanate compound (B-2), a hardener (C), and an alkyl- or alkenylsuccinic acid compound (D) which is a succinic acid or derivative thereof having an alkyl or alkenyl group having a carbon number of from 8 to 24 introduced into an α-position. An amount of the alkyl- or alkenylsuccinic acid compound is 0.01 to 1.8 parts by mass per 100 parts by mass of a sum of the electroconductive powder (A) and the thermosetting ingredient (B).

8 Claims, 2 Drawing Sheets

THERMOSETTING ELECTROCONDUCTIVE PASTE COMPOSITION, AND SOLAR CELL AND SOLAR CELL MODULE BOTH USING THE SAME

TECHNICAL FIELD

The present invention relates to a thermosetting electroconductive paste composition which, when applied to or printed on a base and thermally hardened, can form a hardened film having adhesiveness and electroconductivity, and to a solar cell and a solar cell module both using the thermosetting electroconductive paste composition.

BACKGROUND ART

A method has conventionally been widely known in which an electroconductive paste composition is used in order to form an electrode, electrical wiring (wiring), or the like on a base, e.g., a film, substrate, or electronic component. Known as an example of such electroconductive paste compositions is a thermosetting composition including an electroconductive powder and a thermosetting resin. Specifically, for example, such a thermosetting electroconductive paste composition is applied to or printed on a base so as to result in a given conductor pattern and the coating film or printed film is then dried and hardened by heating. On the base is thus formed a hardened film as an electrode, wiring, or the like having the given conductor pattern.

Fields in which such thermosetting electroconductive paste compositions are used to form electrodes or wiring are not particularly limited, and the compositions can be used in various fields. Representative examples include the field where the conductor electrodes of a solar cell having an amorphous silicon layer are formed. Such a solar cell includes a collector electrode, such as a finger electrode or a busbar electrode, formed in a surface of a solar cell. Such collector electrodes are generally formed by printing an electroconductive paste composition on a surface of a solar cell by a printing technique, e.g., screen printing, and hardening the printed composition.

A known configuration of such thermosetting electroconductive paste compositions employ a silver powder as the electroconductive powder and an epoxy resin and/or a blocked polyisocyanate compound as the thermosetting ingredient. However, because of the expensiveness of silver, electroconductive paste compositions are being developed in recent years in which a powder of copper or a copper alloy (copper-based powder) or a silver-coated copper-based powder obtained by coating the surface of the copper-based powder with silver is used as a less expensive electroconductive powder.

For example, Patent Document 1 discloses a thermosetting electroconductive paste composition that includes an electroconductive powder, which is at least one of a silver-coated metal powder and a powder of either copper or an alloy thereof, and a thermosetting ingredient, which is at least one of an epoxy resin and a blocked polyisocyanate compound, and that further includes a benzotriazole compound, which is benzotriazole or a derivative thereof, and a phosphoric-ester-group-containing dispersant having a phosphoric ester group in the chemical structure, in respective amounts within given ranges.

PRIOR ART DOCUMENT

Patent Document

Patent Document 1: JP-A-2016-131070

SUMMARY OF THE INVENTION

Problems that the Invention is to Solve

It is known that thermosetting electroconductive paste compositions including a copper-based powder as an electroconductive powder, as described in Patent Document 1, give hardened films which tend to have relatively high electrical resistance and are poor also in heat resistance or moisture resistance, as compared with the configuration including a silver powder. In Patent Document 1, a hardened film having not only satisfactory electroconductivity but also excellent heat resistance and moisture resistance has been rendered possible by adding a benzotriazole compound and a phosphoric-ester-group-containing dispersant in combination.

The present inventors diligently made investigations and, as a result, have revealed that a thermosetting electroconductive paste composition containing a copper-based powder as an electroconductive powder and containing an epoxy resin and/or a blocked polyisocyanate compound as a thermosetting ingredient is poorer not only in heat resistance and moisture resistance but also in storage stability than the composition containing a silver powder as an electroconductive powder.

Solar cells tend to be increasingly required to have higher reliability in recent years. Although the reliability of solar cells can be evaluated with respect to various properties, representative examples include excellent moisture resistance. For attaining excellent moisture resistance, a thermosetting electroconductive paste composition for forming collector electrodes is required not only to attain the moisture resistance of the hardened films, i.e., the collector electrodes, but also to attain satisfactory moisture resistance in a solar cell module (including a plurality of solar cells), which is an actual form in which the hardened films are used.

An object of the present invention, which has been achieved in order to solve such problems, is to provide a thermosetting electroconductive paste composition which can attain not only excellent electroconductivity, heat resistance, and moisture resistance but also satisfactory storage stability even when having a relatively reduced silver powder content and which, when applied to solar cells, renders satisfactory reliability possible.

Means for Solving the Problems

The thermosetting electroconductive paste composition according to the present invention has the following configuration for solving those problems: the thermosetting electroconductive paste composition includes an electroconductive powder (A), a thermosetting ingredient (B), and a hardener (C), the electroconductive powder (A) including at least one of a silver-coated metal powder (A-1) and a powder of either copper or an alloy thereof (A-2) and the thermosetting ingredient (B) including an epoxy resin (B-1) and a blocked polyisocyanate compound (B-2). The thermosetting electroconductive paste composition further includes an alkyl- or alkenylsuccinic acid compound (D) which is a succinic acid or derivative thereof having an alkyl or alkenyl group having a carbon number of from 8 to 24 introduced into an α position. An amount of the alkyl- or alkenylsuccinic acid compound (D) is 0.01 to 1.8 parts by mass per 100 parts by mass of a sum of the electroconductive powder (A) and the thermosetting ingredient (B).

According to the configuration, the thermosetting electroconductive paste composition contains an epoxy resin (B-1) and/or a blocked polyisocyanate compound (B-2) as the thermosetting ingredient (B) and contains an alkyl- or alkenylsuccinic acid compound (D) as an additive in an amount within the given range. This configuration enables the composition, which includes a silver-coated metal powder (A-1) or a powder of either copper or an alloy thereof (copper-based powder) (A-2) as the electroconductive powder (A), to not only give hardened films having satisfactory electroconductivity, heat resistance, and moisture resistance but also have satisfactory storage stability, even when having a relatively reduced silver powder content. Furthermore, that configuration enables the thermosetting electroconductive paste composition to impart satisfactory reliability to solar cells to which the composition is applied.

The thermosetting electroconductive paste composition, which has the configuration described above, may have a configuration wherein the alkyl- or alkenylsuccinic acid compound (D) is represented by the following formula (1).

[Chem. 1]

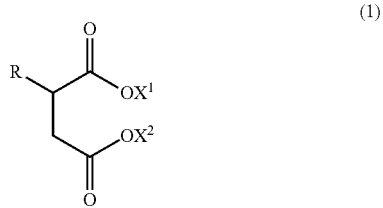

(1)

In the formula, R is an alkyl or alkenyl group having a carbon number of from 8 to 24. $X^1$ and $X^2$ each independently are a monovalent cation, an alkyl or alkenyl group having a carbon number of from 1 to 18, or an alkylene glycol adduct of an alkyl or alkenyl group having a carbon number of from 1 to 18. The alkyl or alkenyl group in the R, $X^1$, or $X^2$ is linear or branched.

The thermosetting electroconductive paste composition, which has the configuration described above, may have a configuration wherein the silver-coated metal powder (A-1) is at least one powder selected from the group consisting of a silver-coated copper powder, a silver-coated copper alloy powder, a silver-coated nickel powder, and a silver-coated aluminum powder.

The thermosetting electroconductive paste composition, which has the configuration described above, may have a configuration wherein the electroconductive powder (A) further includes a silver powder (A-0) and when W1 is a total mass of the at least one of the silver-coated metal powder (A-1) and the powder of either copper or an alloy thereof (A-2) and W2 is a mass of the silver powder (A-0), a mass ratio W1/W2 in the conductive powder (A) is from 100/0 to 1/99.

The thermosetting electroconductive paste composition, which has the configuration described above, may have a configuration wherein the electroconductive powder (A) further includes at least one powder selected from the group consisting of a gold powder, a palladium powder, a nickel powder, an aluminum powder, a lead powder, and a carbon powder (A-3).

The solar cell according to the present invention has a configuration which includes a collector electrode formed from the thermosetting electroconductive paste composition having the configuration described above.

The solar cell, which has the configuration described above, may have a configuration which includes a transparent electroconductive film as a layer which underlies the collector electrode.

The solar cell module according to the present invention has a configuration which includes a solar cell having the configuration described above.

Effects of the Invention

Due to the configurations described above, the present invention produces an effect wherein it is possible to provide a thermosetting electroconductive paste composition which can attain not only excellent electroconductivity, heat resistance, and moisture resistance but also satisfactory storage stability even when having a relatively reduced silver powder content and which, when applied to solar cells, renders satisfactory reliability possible.

MODES FOR CARRYING OUT THE INVENTION

Figure 1:
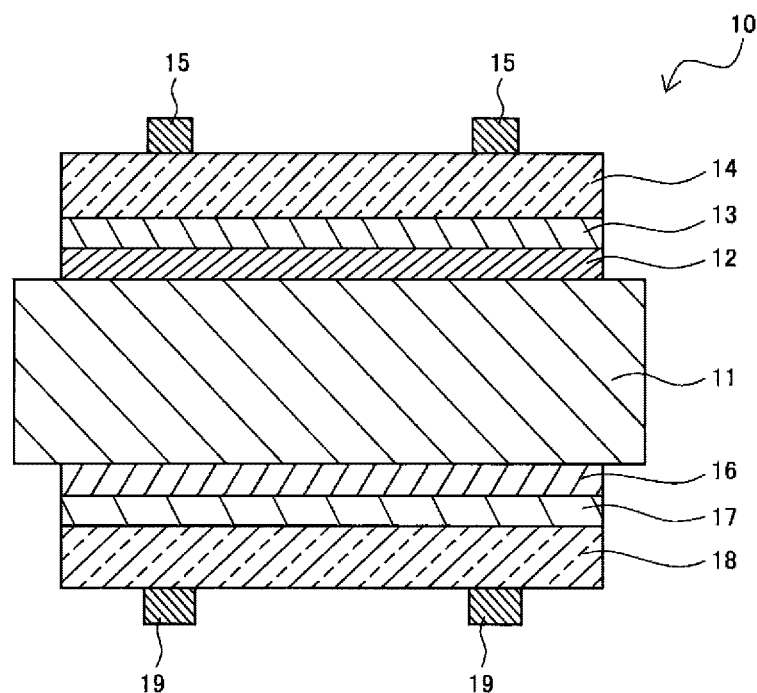
FIG. 1 is a schematic cross-sectional view schematically illustrating the configuration of a solar cell produced using a thermosetting electroconductive paste composition according to the present invention.

One of preferred embodiments of this disclosure are specifically explained below. The thermosetting electroconductive paste composition according to this disclosure includes an electroconductive powder (A), a thermosetting ingredient (B), and a hardener (C), and further includes an alkyl- or alkenylsuccinic acid compound (D) which is a succinic acid or derivative thereof having an alkyl or alkenyl group having a carbon number of from 8 to 24 introduced into the α position.

Among the ingredients (A) to (C), the electroconductive powder (A) includes at least one of a silver-coated metal powder (A-1) and a powder of either copper or an alloy thereof (A-2). The thermosetting ingredient (B) includes at least one of an epoxy resin (B-1) and a blocked polyisocyanate compound (B-2). The amount of the alkyl- or alkenylsuccinic acid compound (D) is 0.01 to 1.8 parts by mass per 100 parts by mass of the sum of the electroconductive powder (A) and the thermosetting ingredient (B).

In the following explanations, the thermosetting electroconductive paste composition according to this disclosure is suitably abbreviated to "electroconductive paste composition" for reasons of convenience. Similarly, the silver-coated metal powder (A-1) is abbreviated to "silver-coated powder (A-1)", the powder of either copper or an alloy thereof (A-2) is abbreviated to "copper-based powder (A-2)", and the alkyl- or alkenylsuccinic acid compound (D) is abbreviated to "alkyl/alkenylsuccinic acid compound (D)".

[(A) Electroconductive Powder]

The electroconductive powder (A) contained in the electroconductive paste composition according to this disclosure includes at least one of a silver-coated powder (A-1) and a copper-based powder (A-2) and may further include a silver powder (A-0). In this disclosure, even in cases where the amount of the silver powder (A-0) in the electroconductive powder (A) contained in the electroconductive paste composition is relatively low, this composition can give hardened films having satisfactory properties. The electroconductive powder (A) may hence be the silver-coated powder (A-1) alone or the copper-based powder (A-2) alone, or may be the silver-coated powder (A-1) and the copper-based powder (A-2) alone. Alternatively, the electroconductive powder (A) may be a combination of the powder (A-1) and/or the powder (A-2) with the silver powder (A-0).

In the electroconductive paste composition according to this disclosure, the electroconductive powder (A) may further include at least one powder selected from the group consisting of a gold powder, a palladium powder, a nickel powder, an aluminum powder, a lead powder, and a carbon powder (A-3). For convenience of explanation, the at least one powder selected from the group consisting of a gold powder, a palladium powder, a nickel powder, an aluminum powder, a lead powder, and a carbon powder (A-3) is referred to as "other electroconductive powder (A-3)". The electroconductive powder (A) may contain an electroconductive powder other than the silver powder (A-0), silver-coated powder (A-1), copper-based powder (A-2), and other electroconductive powder (A-3).

The silver-coated powder (A-1) is not particularly limited so long as the powder (A-1) is a powder which is made of an electroconductive material other than silver and the surface of which is coated with silver. Specific examples of the silver-coated powder (A-1) include a silver-coated copper powder, a silver-coated copper alloy powder, a silver-coated nickel powder, and a silver-coated aluminum powder. The copper-based powder (A-2) also is not particularly limited and may be a copper powder or a powder of a known copper alloy.

The electroconductive powder (A) is not particularly limited in the specific shape thereof. The silver-coated powder (A-1), copper-based powder (A-2), silver powder (A-0), and other electroconductive powder (A-3) each may be spherical (granular) or flaky (scaly). The term "flaky powder" may mean a powder which has a flat shape or the shape of a thin, approximately rectangular parallelepiped as a whole even though partly having recesses or protrusions to have a deformation. The term "spherical powder" may mean a powder which has a three-dimensional shape similar to a cube rather than a rectangular parallelepiped as a whole even though partly having recesses or protrusions to have a deformation.

The amount of the electroconductive powder (A) in the electroconductive paste composition is not particularly limited and may be 70 parts by mass or more and 99 parts by mass or less per 100 parts by mass of the sum of the electroconductive powder (A) and the thermosetting ingredient (B). The amount thereof is more preferably 80 parts by mass or more and 98 parts by mass or less. In the case where the amount of the electroconductive powder (A) is less than 70 parts by mass, there is a possibility that the density of contacts between particles of the electroconductive powder (A) in the hardened electroconductive paste composition (hardened film) might be too low and the hardened film might have insufficient electrical conductivity due to a failure in contacts between particles of the electroconductive powder (A), resulting in an increase in resistivity. Meanwhile, in the case where the amount of the electroconductive powder (A) exceeds 99 parts by mass, the amount of the thermosetting ingredient (B) is too small, resulting in a possibility that the electroconductive powder (A) cannot be evenly dispersed.

The electroconductive powder (A) is not particularly limited also in the specific properties thereof. The electroconductive powder (A) may have any values of average particle diameter, specific surface area, tap density, etc. which are within known ranges. For example, in the case where the electroconductive powder (A) has a flaky shape, the electroconductive powder (A) may have an average particle diameter D50 in the range of, for example, 2 to 20 μm, a BET specific surface area in the range of, for example, 0.1 to 2.0 $m^2/g$, a tap density in the range of, for example, 3 to 10 $g/cm^3$, and an aspect ratio in the range of, for example, 5 to 15. In the case where the electroconductive powder (A) has a spherical shape, the electroconductive powder (A) may have an average particle diameter D50 in the range of 0.1 to 10 μm, a BET specific surface area in the range of 0.5 to 2.0 $m^2/g$, and a tap density in the range of, for example, 1.5 to 10 $g/cm^3$.

In cases where the average particle diameter, specific surface area, or tap density of the electroconductive powder (A) is within the range shown above, the electroconductive paste composition, which contains the alkyl/alkenylsuccinic acid compound (D), can not only attain better properties (electroconductivity, heat resistance, moisture resistance, and storage stability) but also impart satisfactory reliability to solar cells to which the electroconductive paste composition is applied, although these effects depend on various conditions.

In the case where the electroconductive powder (A) includes the silver-coated powder (A-1), there are no particular limitations on silver coating amount. In cases where the mass of the metal powder which has not been coated with silver is taken as 100% by mass, the silver coating amount may be in the range of, for example, 5 to 30% by mass, preferably in the range of 6 to 25% by mass, more preferably in the range of 7.5 to 20% by mass. In cases where the silver coating amount is within that range, the electroconductive paste composition, which contains the alkyl/alkenylsuccinic acid compound (D), can not only attain even better properties but also impart satisfactory reliability to solar cells to which the electroconductive paste composition is applied, although these effects depend on various conditions.

In contrast, too small silver coating amounts may result in cases where the various satisfactory properties which are expected to be brought about by the inclusion of the alkyl/alkenylsuccinic acid compound (D) cannot be attained, depending on various conditions. Meanwhile, in the case where the silver coating amount is too large, the electroconductive powder (A) as a whole has an increased amount of silver used therein, making it impossible to obtain the advantages, including a cost reduction, which are brought about by a reduction in the use amount of the silver powder (A-0).

Whether the electroconductive powder (A) has a flaky shape or a spherical shape, processes for producing the electroconductive powder (A) are not particularly limited and known processes can be used. In the case where the powder (A) is flaky, the flaky powder can be produced, for example, from a spherical powder produced by a known method, by subjecting the spherical powder as a feed powder to a known mechanical treatment. The properties of the feed powder, including particle diameter and the degree of aggregation, can be suitably selected in accordance with the intended use of the electroconductive paste composition (the kind of electrode, wiring, etc. or the kind of an electronic component, electronic device, or the like equipped with the electrode, wiring, etc.). In the case of the spherical powder also, processes for producing the powder are not particularly limited. Examples of the powder include a powder produced by a wet reduction process and spherical powders produced, for example, by other known processes such as an electrolytic process and an atomization process.

In the case where a combination of the silver-coated powder (A-1) and/or the copper-based powder (A-2) with a silver powder (A-0) is used as the electroconductive powder (A), the proportion of the powder (A-1) and the powder (A-2) to the powder (A-0) may be in the range of from 100/0 to 1/99 in terms of mass ratio. In other words, these components of the electroconductive powder (A) may be blended in respective proportions within such ranges that W1/W2 is from 100/0 to 1/99, when W1 is the total mass of the at least one of silver-coated powder (A-1) and the copper-based powder (A-2) and W2 is the mass of the silver powder (A-0).

Namely, in the electroconductive paste composition according to this disclosure, the electroconductive powder (A) is only required to include the silver-coated powder (A-1) and/or the copper-based powder (A-2) and does not have to include the silver powder (A-0). Even in the case where the silver-coated powder (A-1), the copper-based powder (A-2), and the silver powder (A-0) are used in combination, various proportions can be selected in accordance with conditions such as the electroconductivity required of the electroconductive paste composition or the intended use thereof.

[(B) Thermosetting Ingredient]

The thermosetting ingredient (B) to be used in the electroconductive paste composition according to this disclosure includes at least one of an epoxy resin (B-1) and a blocked polyisocyanate compound (B-2). In the case of using the epoxy resin (B-1) and the blocked polyisocyanate compound (B-2) in combination as the thermosetting ingredient (B), the resin (B-1) and the compound (B-2) can be blended in given proportions and used.

The epoxy resin (B-1) is not particularly limited in the specific kind or structure thereof. Examples thereof include polyvalent epoxy resins each having two or more oxirane rings (epoxy groups) in the molecule. Examples thereof include: a glycidyl ether type obtained by reacting epichlorohydrin with a novolac such as a phenol novolac and a cresol novolac, a polyhydric phenol such as bisphenol A, hydrogenated bisphenol A, bisphenol F, bisphenol AD, and resorcinol, or a polyhydric alcohol such as ethylene glycol, neopentyl glycol, glycerin, trimethylolpropane, pentaerythritol, triethylene glycol, and polypropylene glycol; a glycidylamine type obtained by reacting epichlorohydrin with a polyamino compound such as ethylenediamine, triethylenetetramine, and aniline; a glycidyl ester type obtained by reacting epichlorohydrin with a polycarboxyl compound such as adipic acid, phthalic acid, and isophthalic acid; and an alicyclic type synthesized, for example, by olefin oxidation. One of these epoxy resins may be used alone, or two or more thereof may be used in combination.

As the blocked polyisocyanate compound (B-2), compounds known in the field of electroconductive paste compositions can be preferably used.

Specific examples of the polyisocyanate compound include: aromatic isocyanates such as tolylene diisocyanate, diphenylmethane diisocyanate, polymethylene-polyphenyl polyisocyanate, tolidine diisocyanate, xylylene diisocyanate, and naphthalene diisocyanate; and aliphatic polyisocyanates such as hexamethylene diisocyanate, isophorone diisocyanate, hydrogenated xylylene diisocyanate, dicyclohexylmethane diisocyanate, octamethylene diisocyanate, and trimethylhexamethylene diisocyanate. Only one of these polyisocyanate compounds may be used, or a suitable combination of two or more thereof may be used. Those polyisocyanate compounds each may be any of the isocyanurate type, adduct type, or biuret type.

In one embodiment of the invention, an isocyanate-group-terminated compound synthesized by reacting a known polyisocyanate with a known polyol by a known method is also suitable for use as the polyisocyanate compound in this disclosure. The polyol to be used in this synthesis is not particularly limited, and use of common polyols such as polyether polyols, polyester polyols, polycarbonate polyols, polyalkylene polyols, and the like is suitable.

The blocked polyisocyanate compound (B-2) in this disclosure is one obtained by blocking any of the polyisocyanate compounds enumerated above. Blocking agents for the polyisocyanate compounds are not particularly limited. Imidazole compounds, phenols, oximes, and the like are suitable for use.

The amount of the thermosetting ingredient (B) in the electroconductive paste composition is not particularly limited. However, the amount thereof may be 1 parts by mass or more and 30 parts by mass or less, preferably 2 parts by mass or more and 20 parts by mass or less per 100 parts by mass of the sum of the electroconductive powder (A) and the thermosetting ingredient (B). In the Examples, Comparative Examples, and Reference Examples which will be given later, contents of the thermosetting ingredient (B) are shown in the tables in terms of mass ratio of the electroconductive powder (A) to the thermosetting ingredient (B) ((A)/(B) mass ratio).

In the case where the amount of the thermosetting ingredient (B) in the electroconductive paste composition is less than 1 part by mass, there is a possibility that the amount of the thermosetting ingredient (B) might be too small to evenly disperse the electroconductive powder (A). Meanwhile, in the case where the amount of the thermosetting ingredient (B) exceeds 30 parts by mass, there is a possibility that the density of contacts between particles of the electroconductive powder (A) in the hardened electroconductive paste composition (hardened film) might be too low and the hardened film might have insufficient electrical conductivity due to a failure in contacts between particles of the electroconductive powder (A), resulting in an increase in resistivity. In cases where the amount of the thermosetting ingredient (B) is in the range of, for example, 4 to 7 parts by mass, the electroconductive paste composition, which contains the alkyl/alkenylsuccinic acid compound (D), can not only attain better various properties but also impart satisfactory reliability to solar cells to which the electroconductive paste composition is applied, as will be demonstrated by the Examples later, although these effects depend on various conditions.

In the case where the epoxy resin (B-1) and the blocked polyisocyanate compound (B-2) are used in combination as the thermosetting ingredient (B) in the electroconductive paste composition according to this disclosure, the mixing ratio (blending ratio) therebetween is not particularly limited. The resin (B-1) and the compound (B-2) may be blended in a mass ratio in the range of from 10/90 to 90/10 or in the range of from 20/80 to 80/20.

In the case where the amount of the epoxy resin (B-1), per 100 parts by mass of the sum of the epoxy resin (B-1) and the blocked polyisocyanate compound (B-2), is less than 10 parts by mass, that is, in the case where the amount of the blocked polyisocyanate compound (B-2) exceeds 90 parts by mass, the electroconductive paste composition may give hardened materials (electrodes, wiring, etc.) reduced in strength and adhesiveness, although this depends on the makeup of the electroconductive paste composition, etc. Meanwhile, in the case where the amount of the epoxy resin (B-1) exceeds 90 parts by mass, that is, in the case where the amount of the blocked polyisocyanate compound (B-2) is less than 10 parts by mass, the effect wherein the hardening shrinkage of the blocked polyisocyanate compound (B-2) enhances contacts between particles of the electroconductive powder (A) may be lessened, resulting in a decrease in electroconductivity, although this depends on the makeup of the electroconductive paste composition, etc.

The electroconductive paste composition according to this disclosure may contain resins or compounds, as the thermosetting ingredient (B), besides the epoxy resin (B-1) and/or the blocked polyisocyanate compound (B-2). Examples thereof include resins usable as binders, such as phenolic resins, polyester resins, polyurethane resins, acrylic resins, melamine resins, polyimide resins, and silicone resins. Such resins or compounds are not particularly limited.

[(C) Hardener]

The hardener (C) to be used in the electroconductive paste composition according to this disclosure is not particularly limited so long as the hardener (C) includes a compound capable of hardening the thermosetting ingredient (B). Since the epoxy resin (B-1) and/or blocked polyisocyanate compound (B-2) described above is used as the thermosetting ingredient (B) in this composition, the hardener (C) is not particularly limited in the kind thereof, etc. so long as the hardener (C) is capable of hardening the epoxy resin (B-1) or the blocked polyisocyanate (B-2) (or both). Examples thereof include various compounds which are known in the field of electroconductive paste compositions.

Specific examples thereof include: acid anhydrides such as phthalic anhydride, trimellitic anhydride, pyromellitic anhydride, maleic anhydride, tetrahydrophthalic anhydride, methyltetrahydrophthalic anhydride, hexahydrophthalic anhydride, methylhexahydrophthalic anhydride, and succinic anhydride; imidazole compounds such as imidazole, 2-methylimidazole, 2-ethyl-4-methylimidazole, 2-undecylimidazole, 2-heptadecylimidazole, 1-benzyl-2-methylimidazole, 2-phenyl-4-methylimidazole, 1-cyanoethyl-2-methylimidazole, 1-aminoethyl-2-methylimidazole, 1-methylimidazole, and 2-ethylimidazole; tertiary amines such as dimethyloctylamine, dimethyldecylamine, dimethyllaurylamine, dimethylmyristylamine, dimethylpalmitylamine, dimethylstearylamine, dimethylbehenylamine, dilaurylmonoethylamine, methyldidecylamine, methyldioleylamine, triallylamine, triisopropanolamine, triethylamine, 3-(dibutylamino)propylamine, tri-n-octylamine, 2,4,6-trisdimethylaminomethylphenol, triethanolamine, methyldiethanolamine, and diazabicycloundecene; boron-fluoride-containing Lewis acids or salts thereof, such as boron trifluoride ethyl ether, boron trifluoride phenol, boron trifluoride piperidine, acetic acid boron trifluoride, boron trifluoride monomethylamine, boron trifluoride monoethylamine, boron trifluoride triethanolamine, and boron trifluoride monoethanolamine; amine adducts such as AJICURE Series PN-23 or MY-24, commercially available from Ajinomoto Fine-Techno Co., Inc., and FUJICURE Series FXR-1020 or FXR-1030, commercially available from Fuji Kasei Kogyo Co., Ltd.; and dicyandiamide. Only one of these compounds may be used, or a suitable combination of two or more thereof may be used.

The amount of the hardener (C) to be incorporated (added) is not particularly limited. In one embodiment, the amount of the hardener (C) may be in the range of 0.1 parts by mass or more and 10 parts by mass or less per 100 parts by mass of the sum of the electroconductive powder (A) and the thermosetting ingredient (B), and is preferably 0.2 parts by mass or more and 5 parts by mass or less, more preferably 0.3 parts by mass or more and 1 part by mass or less. In the case where the amount of the hardener (C) incorporated is less than 0.1 parts by mass, there is a possibility that the hardening of the thermosetting ingredient (B) might be insufficient or that the composition might give hardened materials (electrodes, wiring, etc.) having unsatisfactory electroconductivity. Meanwhile, in the case where the amount thereof exceeds 10 parts by mass, not only there is a possibility that the paste viscosity might be excessively high but also the function of hardening the thermosetting ingredient (B) is not high for the amount of the hardener (C) incorporated. [(D) Alkyl- or Alkenylsuccinic Acid Compound]

The alkyl- or alkenylsuccinic acid compound (D) to be used in the electroconductive paste composition according to this disclosure is only required to be an alkylsuccinic acid or alkenylsuccinic acid having an alkyl or alkenyl group having a carbon number of from 8 to 24 introduced into the α-position carbon atom (α carbon atom) of succinic acid or to be a derivative of the alkyl- or alkenylsuccinic acid.

The alkyl/alkenylsuccinic acid compound (D) is not particularly limited in the more specific structure thereof. Representative examples thereof include alkylsuccinic acids or alkenylsuccinic acids which have a structure represented by the following formula (1), salts of these succinic acids, and esters of these succinic acids.

[Chem. 2]

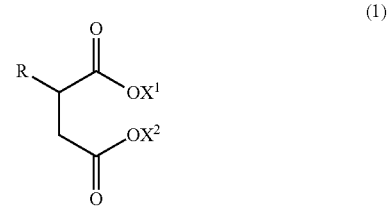

(1)

R (organic group introduced into the α carbon atom of succinic acid) in the formula (1) is an alkyl or alkenyl group having a carbon number of from 8 to 24. $X^1$ and $X^2$ in the formula (1) each independently are a monovalent cation, an alkyl or alkenyl group having 1 to 18 carbon atoms, or an alkylene glycol adduct of an alkyl or alkenyl group having a carbon number of from 1 to 18. The alkyl or alkenyl group in R, $X^1$, or $X^2$ may be linear or branched.

The monovalent cations represented by $X^1$ and $X^2$ are not particularly limited. Preferred examples thereof include a hydrogen ion, metal ions, e.g., alkali metal ions, and ammonium ions. The term "ammonium ions" means ions including not only the ammonium ion (NH4$^+$) in the narrow sense but also substituted ammonium ions (aminium ions) formed by replacing one or more of the hydrogen atoms of the narrow-sense ammonium ion with one or more organic groups.

More preferred examples of the alkyl or alkenyl group represented by R in the formula (1) are not particularly limited. However, more preferred are, for example, alkyl or alkenyl groups having a carbon number of from 10 to 20. $X^1$ and $X^2$ in the formula (1) are not particularly limited, but more preferred examples thereof include a hydrogen ion, ammonium ions, and alkyl groups having a carbon number of from 1 to 8.

The amount of the alkyl/alkenylsuccinic acid compound (D) to be incorporated (added) may be 0.01 parts by mass or more and 1.8 parts by mass or less per 100 parts by mass of the sum of the electroconductive powder (A) and the thermosetting ingredient (B), and is preferably 0.1 parts by mass or more and 1.5 parts by mass or less. In the case where the amount of the alkyl/alkenylsuccinic acid compound (D) incorporated is less than 0.01 part by mass or exceeds 1.8 parts by mass, the electroconductive paste composition can neither attain various satisfactory properties nor impart satisfactory cell characteristics and reliability to solar cells to which the electroconductive paste composition is applied.

[Production and Use of the Electroconductive Paste Composition]

Methods for producing the electroconductive paste composition according to this disclosure are not particularly limited, and methods known in the field of electroconductive paste compositions can be preferably used. A representative example is a method in which the ingredients described above are mixed together in given proportions (by mass) and the mixture is treated with a known kneading device to obtain a paste. Examples of the kneading device include a three-roll mill.

The electroconductive paste composition according to this disclosure may contain a solvent (E) known in the field of electroconductive paste compositions and various additives according to need, besides the ingredients described above (the electroconductive powder (A), thermosetting ingredient (B), hardener (C), and alkyl/alkenylsuccinic acid compound (D)). The additives are not particularly limited, and examples thereof include leveling agents, antioxidants, ultraviolet absorbers, silane coupling agents, defoamers, and viscosity regulators. Such additives can be added so long as the effects of this disclosure are not lessened thereby.

The solvent (E) is added in order to regulate properties, e.g., viscosity or flowability, of the electroconductive paste composition according to this disclosure. The viscosity of the electroconductive paste composition is not particularly limited and may be regulated to a value within a suitable range in accordance with the method for conductor pattern formation (e.g., screen printing) which will be described later. The flowability and other properties of the electroconductive paste composition may also be regulated so as to be within suitable ranges according to various conditions.

The solvent (E) is not particularly limited in the specific kind thereof. Examples thereof include: saturated hydrocarbons such as hexane; aromatic hydrocarbons such as toluene; glycol ethers (Cellosolves) such as ethyl Cellosolve, butyl Cellosolve, and butyl Cellosolve acetate; glycol ethers such as diethylene glycol diethyl ether and butyl Carbitol (diethylene glycol monobutyl ether); acetic acid esters of glycol ethers, such as butyl diglycol acetate and butyl Carbitol acetate; alcohols such as diacetone alcohol, terpineol, and benzyl alcohol; ketones such as cyclohexanone and methyl ethyl ketone; and esters such as DBE, 2,2,4-trimethyl-1,3-pentanediol monoisobutyrate, and 2,2,4-trimethyl-1,3-pentanediol diisobutyrate. Only one of these solvents may be used, or a suitable combination of two or more thereof may be used.

The amount of the solvent (E) is not particularly limited, and the solvent (E) can be added in such an amount that the viscosity, flowability, or the like of the electroconductive paste composition can be regulated to a value within a suitable range. In the case where the amount of the solvent (E) exceeds 40% by mass based on the whole electroconductive paste composition, it may be impossible to obtain flowability suitable for printing and the electroconductive paste composition may have reduced printability, although this depends on the kinds of the other ingredients or the makeup of the electroconductive paste composition.

Methods for forming a conductor pattern from the electroconductive paste composition according to this disclosure are not particularly limited, and various known methods for conductor pattern formation can be preferably used. Representative examples thereof include screen printing as will be shown later in the Examples. Also usable are printing techniques such as gravure printing, offset printing, ink jet printing, a dispenser method, and dipping.

The electroconductive paste composition according to this disclosure can be extensively utilized, for example, for forming high-precision electrodes or wiring or for bonding electronic components. Specifically, for example, the electroconductive paste composition is suitable for use in applications such as: the conductor electrodes of solar cells; the internal electrodes or external electrodes of chip type electronic components; and electrodes, wiring, or bonding for RFIDs (radio frequency identifiers), electromagnetic shields, oscillators, membrane switches, touch panels, or components for use in electroluminescence, etc.

[Solar Cell and Solar Cell Module]

The electroconductive paste composition according to this disclosure is especially suitable for use in the filed of solar cells, among the applications shown above. Specifically, the electroconductive paste composition according to this disclosure is suitable for forming, for example, the collector electrodes of a solar cell.

The solar cell according to this disclosure is not particularly limited so long as the solar cell is one produced using the electroconductive paste composition according to this disclosure and including an electrode formed over a semiconductor substrate by printing the electroconductive paste composition and burning the printed composition. Examples of common solar cells include one having a configuration including a semiconductor substrate, a diffusing layer, an antireflection layer, a back surface field (BSF) layer, a front electrode, and a back electrode. The front electrode and the back electrode are each a collector electrode and can be formed as an electrode having a given pattern using the electroconductive paste composition according to this disclosure.

In the Examples which will be given later, electroconductive paste compositions according to this disclosure (and electroconductive paste compositions of Comparative Examples or Reference Examples) were used to produce solar cells of the heterojunction type and the solar cells were evaluated for reliability. As shown in FIG. 1, a solar cell 10 of the heterojunction type has a configuration including an n-type single-crystal silicon substrate 11, which is a semiconductor substrate, a p-type amorphous silicon layer 13 formed over the front surface (light-receiving surface) of the silicon substrate 11, and an n-type amorphous silicon layer 17 formed over the back surface of the silicon substrate 11. In the following explanations, like or corresponding elements are designated by like numerals throughout all the drawings and duplications of explanation are omitted.

In the solar cell 10 having the configuration shown in FIG. 1, i-type amorphous silicon layers 12 and 16 which are substantially authentic (containing no impurity) have been formed at the heterojunction interfaces. The i-type amorphous silicon layer 12 has been formed at the interface between the n-type single-crystal silicon substrate 11 and the p-type amorphous silicon layer 13, and the i-type amorphous silicon layer 16 has been formed at the interface between the n-type single-crystal silicon substrate 11 and the n-type amorphous silicon layer 17. By forming the i-type amorphous silicon layer 12 or 16, defects are diminished at the heterojunction interface to thereby improve the interface properties.

With respect to each of the layers constituting the solar cell 10 having the configuration shown in FIG. 1, the surface thereof facing the n-type single-crystal silicon substrate 11 is referred to as "inner surface" and the surface thereof opposite from the n-type single-crystal silicon substrate 11 is referred to as "outer surface", for convenience of explanation. As shown in FIG. 1, the inner surface of the p-type amorphous silicon layer 13 or n-type amorphous silicon layer 17 constitutes the heterojunction interface, and a transparent electroconductive film 14 or 18 has been formed on the outer surface (the surface opposite from the heterojunction interface) of the amorphous silicon layer 13 or 17. Furthermore, collector electrodes 15 and 19 have been formed respectively on the outer surfaces of the transparent electroconductive films 14 and 18.

At least one of the collector electrodes 15 and 19 (in many cases, the collector electrode 15 on the front surface (light-receiving surface) side) is formed from the electroconductive paste composition according to this disclosure. Consequently, in the solar cell 10 having the configuration shown in FIG. 1, the transparent electroconductive film 14 or 18 has been disposed as a layer underlying the collector electrode 15 or 19.

The overall configuration of the solar cell 10 shown in FIG. 1 is as follows. A p-type amorphous silicon layer 13 has been disposed over the front surface (light-receiving surface; front-side surface) of the n-type single-crystal silicon substrate 11, with an i-type amorphous silicon layer 12 interposed therebetween. A transparent electroconductive layer 14 has been disposed on the outer surface (front surface) of the p-type amorphous silicon layer 13, and a collector electrode 15 having a given pattern has been disposed on the outer surface (front surface) of the transparent electroconductive film 14. An n-type amorphous silicon layer 17 has been disposed over the back surface (back-side surface) opposite from the light-receiving surface) of the n-type single-crystal silicon substrate 11, with an i-type amorphous silicon layer 16 interposed therebetween. A transparent electroconductive layer 18 has been disposed on the outer surface (back surface) of the n-type amorphous silicon layer 17, and a collector electrode 19 having a given pattern has been disposed on the outer surface (back surface) of the transparent electroconductive film 18.

The n-type single-crystal silicon substrate 11, amorphous silicon layers 12, 13, 16, and 17, and transparent electroconductive films 14 and 18 which constitute the solar cell 10 are each not particularly limited in the specific configuration thereof (material, thickness, surface state, etc.). Processes for producing the solar cell 10 also are not particularly limited, and known processes can be used (see the Examples which will be given later). The solar cell according to this disclosure may be any solar cell produced using the electroconductive paste composition according to this disclosure as stated above, and it is a matter of course that the type thereof is not limited to the heterojunction type. The configuration of the heterojunction type solar cell is not limited to the configuration shown in FIG. 1 and the solar cell may have another configuration.

The solar cell according this disclosure can be used as such as a solar cell package. A plurality of the solar cells can be arranged in accordance with a given pattern and integrated into a package, thereby producing a solar cell module.

The solar cell module is not particularly limited in the specific configuration thereof and may have any configuration including solar cells according to this disclosure (solar cells each having an electrode formed by printing the electroconductive paste composition according to this disclosure and burning the printed composition). Examples thereof include a solar cell module 20 shown in FIG. 2, which is configured by using a plurality of heterojunction type solar cells 10 having the configuration shown in FIG. 1, connecting the solar cells 10 to each other with tabs 21, and integrating the connected solar cells 10 into a package.

This solar cell module 20 includes: a platy filling material 22, in which the multiple solar cells 10 connected with the tabs 21 have been arranged; a front-surface protection glass 23 disposed on one surface of the filling material 22; and a back-surface protection material 24 disposed on the other surface of the filling material 22. The configuration in which the multiple solar cells 10 are disposed in the filling material 22 is not particularly limited, and this configuration may generally be attained by holding the solar cells 10 between a pair of filling materials 22. Any adjacent solar cells 10 have been connected to each other with a tab 21. One end of the tab 21 has been connected to the front surface (light-receiving surface) of one of the adjacent solar cells 10, and the other end of the tab 21 has been connected to the back surface of the other solar cell 10.

Such a solar cell module 20 can be used as high-power high-voltage solar cells because photoelectric current can be collectively outputted from the multiple solar cells 10. The tabs 21, front-surface protection glass 23, and back-surface protection material 24 which are components of the solar cell module 20 are each not particularly limited in the specific configuration thereof (material, thickness, structure, etc.). Processes for producing the solar cell module 20 also are not particularly limited, and known processes can be used (see the Examples given below).

EXAMPLES

This disclosure is explained in more detail by reference to Examples, Comparative Examples, and Reference Examples, but this disclosure is not limited to the Examples. Various changes and modifications can be made in the disclosed composition, solar cell, and module by a person skilled in the art within the scope of this disclosure. In the following Examples, Comparative Examples, and Reference Examples, properties were examined or evaluated in the following manners.

(Examination/Evaluation Methods)
[Methods for evaluating Electroconductive Powder]
(1) Average Particle Diameter D50

The average particle diameter D50 of a flaky or spherical powder was evaluated by laser diffractometry in the following manner. A 0.3 g sample of the flaky or spherical powder was weighed in a 50 mL beaker, and 30 mL of isopropyl alcohol was added thereto. The contents were treated with an ultrasonic cleaner (USM-1, manufactured by AS ONE Corp.) for 5 minutes to disperse the powder. The resultant dispersion was examined for average particle diameter D50 using a particle size distribution analyzer (Microtrac 9320-HRA X-100, manufactured by Nikkiso Co., Ltd.).

(2) Evaluation of BET Specific Surface Area

The BET specific surface area of a flaky or spherical powder was evaluated by examining 1 g of a sample thereof using Monosorb (manufactured by Quantachrome Corp.) by the BET one-point method based on nitrogen adsorption. In the examination for BET specific surface area, the degassing before the measurement was conducted under the condition of 60° C. for 10 minutes.

(3) Evaluation of Tap Density

The tap density of a flaky or spherical powder was evaluated in the following manner. A tap density measuring device (bulk density measuring device SS-DA-2, manufactured by Sibayama Scientific Co., Ltd.) was used, and 15 g sample was weighed and placed in 20 mL test tube. This test tube was tapped 1,000 times by dropping from a height of 20 mm. The tap density was calculated using the following equation.

Tap density=[mass of sample (15 g)]/[volume of sample after tapping (cm³)]

[Evaluation of Conductor Resistance]

Figure 3:
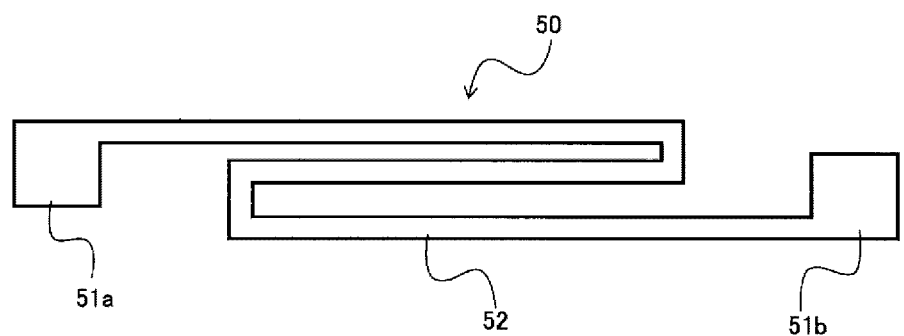
FIG. 3 is a plan view schematically showing the configuration of a conductor pattern for evaluation which was used for the resistance examination and evaluation of hardened films of thermosetting electroconductive paste compositions in Examples according to this disclosure, Comparative Examples, and Reference Examples.

An alumina substrate was used as a base material. The electroconductive paste compositions of the Examples, Comparative Examples, and Reference Examples were each applied to a surface of the alumina substrate by screen printing to form a conductor pattern for evaluation 50 including a terminal 51a and a terminal 51b which were disposed at both ends and further including a wiring part 52 having a zigzag shape, as shown in FIG. 3, and to further form a conductor pattern having a square shape of 2 mm×2 mm (square pattern) not shown. Thereafter, this alumina substrate was heated in a 180° C. hot-air drying oven for 60 minutes to harden the conductor pattern for evaluation 50 (electroconductive paste composition). Thus, a sample for resistivity evaluation was produced.

The samples for resistivity evaluation of the Examples, Comparative Examples, and Reference Examples were each examined for the film thickness of the hardened conductor pattern for evaluation 50 (hardened film) with a surface roughness meter (Surfcom 480A, manufactured by Tokyo Seimitsu Co., Ltd.) and for electrical resistance with a digital multimeter (R6551, manufactured by Advantest Corp.). The conductor resistance (μΩ·cm) of the conductor pattern for evaluation 50 was calculated from the film thickness and the electrical resistance and from the aspect ratio of the wiring pattern. This conductor resistance was used as an index for evaluating the electroconductivity of the hardened film of each electroconductive paste composition.

[Evaluation of Reliability]

A conductor pattern for evaluation 50 was evaluated for moisture resistance as an index to the reliability of the conductor pattern for evaluation 50.

A sample for resistivity evaluation produced in the same manner as for the conductor resistance examination described above was stored for 1,000 hours in a thermo-hygrostatic chamber (trade name, SH-262; manufactured by ESPEC Corp.) set at a temperature of 85° C. and a humidity of 85%. With respect to each of the resistivity-evaluation sample of before the storage and that of after the storage, the resistivity was calculated in the same manner as for the evaluation of conductor resistance described above. The change of resistance after the storage relative to the initial resistance before the storage, was evaluated as the moisture resistance of the conductor pattern for evaluation 50.

[Measurement of Paste Viscosity]

The paste viscosity of each of the electroconductive paste compositions of the Examples, Comparative Examples, and Reference Examples was measured with viscometer DV-III, manufactured by Brookfield Inc. CP-52 was used as the cone for measurement, and the composition was examined for paste viscosity (η1 rpm) at a rotational speed of 1 rpm (shear rate, 2 s$^{-1}$).

[Storage Stability]

The storage stability of each of the electroconductive paste compositions of the Examples, Comparative Examples, and Reference Examples was evaluated by examining the electroconductive paste composition for viscosity and for the conductor resistance described above.

The electroconductive paste composition was stored for 3 days under the conditions of a temperature of 30° C. and then examined for viscosity. The viscosity of the electroconductive paste composition of before the storage (initial viscosity) was taken as 100 to calculate the change of viscosity through the storage. The case where the change of viscosity through the storage was 100 or larger but less than 120 is indicated by "○", the case where the change of viscosity was 120 or larger but less than 150 is indicated by "Δ", and the case where the change of viscosity was 150 or larger is indicated by "×".

Meanwhile, the electroconductive paste composition which had undergone the storage was used to produce a sample for resistivity evaluation in the same manner as for the measurement of conductor resistance described above. The conductor resistance of the conductor pattern for evaluation 50 was calculated in the same manner as for the measurement of conductor resistance described above. This conductor resistance was evaluated as an index to the storage stability of the electroconductive paste composition.

[Production of Solar Cells]

The electroconductive paste compositions of the Examples, Comparative Examples, and Reference Examples were each used to produce heterojunction type solar cells 10 having the configuration shown in FIG. 1.

An n-type single-crystal silicon substrate 11 having a thickness of about 300 μm was used. This n-type single-crystal silicon substrate 11 had pyramidal protrusions having a height of about several to ten micrometers formed on the outer surfaces (both front and back surfaces).

An i-type amorphous silicon layer 12 having a thickness of 50 Å was formed on the front-side outer surface (front surface) of the n-type single-crystal silicon substrate 11 by RF plasma CVD. A p-type amorphous silicon layer 13 having a thickness of 50 Å was formed on the outer surface (front surface) of the i-type amorphous silicon layer 12 by RF plasma CVD.

An i-type amorphous silicon layer 16 having a thickness of 50 Å was formed on the back-side outer surface (back surface) of the n-type single-crystal silicon substrate 11 by RF plasma CVD. An n-type amorphous silicon layer 17 having a thickness of 50 Å was formed on the outer surface (back surface) of the i-type amorphous silicon layer 16 by RF plasma CVD.

Furthermore, transparent electroconductive films 14 and 18 each having a thickness of 1,000 Å were formed by magnetron sputtering respectively on the outer surface (front surface) of the p-type amorphous silicon layer 13 and on the outer surface (back surface) of the n-type amorphous silicon layer 17. The material of the transparent electroconductive films 14 and 18 was indium-tin oxide (ITO).

Collector electrodes 15 and 19 were formed respectively on the outer surfaces of the transparent electroconductive films 14 and 18. The collector electrodes 15 and 19 were formed from the electroconductive paste composition of each of the Examples, Comparative Examples, and Reference Examples which will be given later. The electroconductive paste composition was printed in accordance with a given pattern on the outer surface (front or back surface) of the transparent electroconductive film 14 or 18 by screen printing. The electroconductive paste composition printed was thermally hardened by heating at 180° C. for 1 hour, thereby forming the collector electrode 15 or 19 having the given pattern. Thus, solar cells 10 of the Examples, Comparative Examples, and Reference Examples were obtained.

[Production of Solar Cell Modules]

Figure 2:
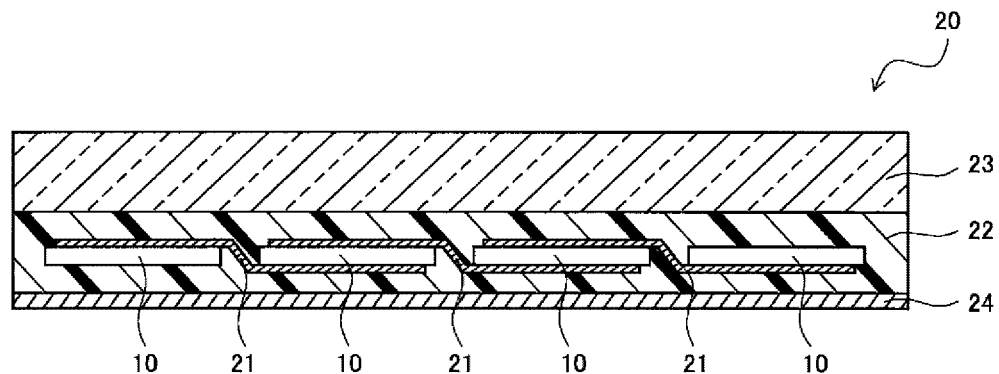
FIG. 2 is a schematic cross-sectional view schematically illustrating the configuration of a solar cell module which includes solar cells shown in FIG. 1.

The solar cells 10 produced in the manner described above were used to produce a solar cell module 20 having the configuration shown in FIG. 2, in the following manner.

Use was made of tabs 21 each constituted of a copper foil having surfaces coated with a lead-free solder based on Sn—Ag—Cu. A tab 21 was heated and connected to the collector electrode 15 of one of adjacent solar cells 10 and to the collector electrode 19 of the other solar cell 10. In this manner, a plurality of solar cells 10 were serially connected.

Next, a filling material 22 made of an ethylene-vinyl acetate copolymer (EVA) was placed on a front-surface protection glass 23, and the multiple solar cells 10 serially connected with the tabs 21 were then placed on the filling material 22. A filling material 22 made of the EVA was further placed thereon. Thus, the multiple solar cells 10 were held between and inside the filling materials 22. A back-surface protection material 24 was placed on the back-side filling material 22. The back-surface protection material 24 was a laminate having a three-layer structure composed of poly(ethylene terephthalate) (PET)/aluminum foil/PET.

The multilayer structure thus obtained (configured of the front-surface protection glass 23, the filling materials 22 (containing the multiple solar cells 10 connected with the tabs 21 and held between and inside the filling materials 22), and the back-surface protection material 24) was pressed with heating. Thus, the front-surface protection glass 23, the filling materials 22, the multiple solar cells 10 connected with the tabs 21, and the back-surface protection material 24 were integrated, thereby obtaining a solar cell module 20 of each of the Examples, Comparative Examples, and Reference Examples.

[Evaluation of the Solar Cells]

The solar cells 10 produced in the manner described above were examined with a solar cell inspection system (trade name, KSX-3000H; manufactured by Kyoshin Electric Corp.). A maximum output Pmax obtained with the solar cells 10 of Reference Example 1 was used as a reference (100), and the maximum output Pmax of the solar cells 10 of each of the Examples, Comparative Examples, and Reference Examples was expressed as a relative value to evaluate the cell characteristics thereof.

Furthermore, the solar cell modules 20 produced in the manner described above were each evaluated for reliability by examining the moisture resistance thereof as an index to the reliability, in the same manner as for the reliability of the conductor pattern for evaluation 50.

The solar cell module 20 of each of the Examples, Comparative Examples, and Reference Examples was stored for 2,000 hours in a thermo-hygrostatic chamber (trade name, SMS-2; manufactured by ESPEC Corp.) set at a temperature of 85° C. and a humidity of 85%. Each of the solar cell module 20 of before the storage and that of after the storage was examined with a solar cell inspection system (trade name, KSX-2012HM; manufactured by Kyoshin Electric Corp.). The rate of the module output after the storage to the module output before the storage was obtained to evaluate the module characteristics.

[(A) Electroconductive Powders, (B) Thermosetting Ingredients, and (C) Hardeners]

In each of the following Examples, Comparative Examples, and Reference Examples, use was made of at least one of the twelve electroconductive powders (A) shown in the following Table 1. These electroconductive powders (A) were two silver powders (A-0), eight silver-coated powders (A-1), and two copper-based powders (A-2).

TABLE 1

| (A) Electroconductive powder | Shape | Average particle diameter D50 [μm] | BET specific surface area [m$^2$/g] | Tap density [g/cm$^3$] | Silver coating amount [mass %] |
|---|---|---|---|---|---|
| (A-01) Silver powder | spherical | 1.1 | 1.5 | 3.5 | — |
| (A-02) Silver powder | flaky | 5.7 | 0.5 | 4.5 | — |
| (A-101) Silver-coated copper powder | spherical | 1.0 | 1.5 | 3.5 | 20.0 |
| (A-102) Silver-coated copper powder | spherical | 2.9 | 0.5 | 4.0 | 7.5 |
| (A-103) Silver-coated copper powder | spherical | 5.3 | 0.3 | 4.5 | 10.2 |
| (A-104) Silver-coated copper powder | spherical | 8.0 | 0.2 | 4.0 | 15.1 |
| (A-105) Silver-coated copper powder | flaky | 8.5 | 0.3 | 4.5 | 15.0 |
| (A-12) Silver-coated copper alloy powder | spherical | 4.4 | 0.3 | 3.9 | 10.0 |

TABLE 1-continued

| (A) Electroconductive powder | Shape | Average particle diameter D50 [μm] | BET specific surface area [m²/g] | Tap density [g/cm³] | Silver coating amount [mass %] |
|---|---|---|---|---|---|
| (A-13) Silver-coated nickel powder | spherical | 3.0 | 0.8 | 3.1 | 20.0 |
| (A-14) Silver-coated aluminum powder | spherical | 6.0 | 0.2 | 1.5 | 20.0 |
| (A-21) Copper powder | spherical | 5.6 | 0.3 | 4.4 | — |
| (A-22) Copper alloy powder | spherical | 4.3 | 0.3 | 3.8 | — |

In each of the following Examples, Comparative Examples, and Reference Examples, two of the four compounds shown in the following Table 2 were selected and used in combination as a thermosetting ingredient (B). As a hardener (C) was used one of the two compounds shown in the following Table 2.

TABLE 2

| (B) Thermosetting ingredient (C) Hardener | Compound name |
|---|---|
| (B-11) Epoxy resin | bisphenol A epoxy resin [trade name jER825, manufactured by Mitsubishi Chemical Corp.; epoxy equivalent, 170-180] |
| (B-12) Epoxy resin | phenol-novolac epoxy resin [trade name jER152, manufactured by Mitsubishi Chemical Corp.; epoxy equivalent, 172-178] |
| (B-21) Blocked polyisocyanate compound | product of reaction between polymethylene-polyphenyl polyisocyanate and polycarbonate polyol [blocking agent: methyl ethyl ketone oxime] |
| (B-22) Blocked polyisocyanate compound | product of reaction between isocyanurate type polyisocyanate of hexamethylene diisocyanate and polypropylene polyol [blocking agent: methyl ethyl ketone oxime] |
| (C-1) Hardener 1 | boron trifluoride monomethylamine |
| (C-2) Hardener 2 | 2-ethyl-4-methylimidazole |

In each of the following Examples, Comparative Examples, and Reference Examples, one of the twenty-three compounds shown in the following Table 3 was used as an alkyl/alkenylsuccinic acid compound (D) represented by the following formula (1). In Table 3 are also shown four comparative compounds (CM-1 to CM-4) used in Comparative Examples in place of the alkyl/alkenylsuccinic acid compounds (D).

In the following Table 3, each alkyl/alkenylsuccinic acid compound (D) is indicated not by the name thereof but by specifying the compound by specifying the R, $X^1$, and $X^2$ contained in the following formula (1). In Table 3, the numeral affixed to the C in "C8", "C10", "C12", or the like indicates the number of carbon atoms of the alkyl or alkenyl group, and the group is linear unless indicated by "branched". In Table 3, "EO" is an abbreviation for ethylene oxide, and "PO" is an abbreviation for propylene oxide.

[Chem. 3]

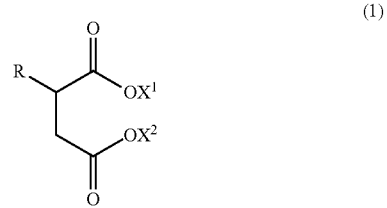

(1)

TABLE 3

| (D) Alkyl- or alkenylsuccinic acid compound | | |
|---|---|---|
| R | $X^1$ | $X^2$ |
| (D-01) C8 alkenyl group | hydrogen (H) | hydrogen (H) |
| (D-02) C8 alkenyl group | octyl group | hydrogen (H) |
| (D-03) C10 alkenyl group | ammonium | ammonium |
| (D-04) C10 alkenyl group | butyl group | hydrogen (H) |

TABLE 3-continued

(D) Alkyl- or alkenylsuccinic acid compound

| R | $X^1$ | $X^2$ |
|---|---|---|
| (D-05) C12 alkenyl group | hydrogen (H) | hydrogen (H) |
| (D-06) C12 alkenyl group | methyl group | hydrogen (H) |
| (D-07) C12 alkenyl group | ethyl 2EO adduct | hydrogen (H) |
| (D-08) C12 alkenyl group | butyl 8EO adduct | hydrogen (H) |
| (D-09) C12 alkenyl group | lauryl 3PO adduct | hydrogen (H) |
| (D-10) C12 alkenyl group | ammonium | ammonium |
| (D-11) C12 alkenyl group | monoethanolammonium | monoethanolammonium |
| (D-12) C12 alkenyl group | piperidinium | piperidinium |
| (D-13) branched C12 alkenyl group | triethanolammonium | hydrogen (H) |
| (D-14) C12 alkenyl group | sodium (Na) | sodium (Na) |
| (D-15) C14 alkyl group | hydrogen (H) | hydrogen (H) |
| (D-16) C16 alkenyl group | potassium (K) | potassium (K) |
| (D-17) C16 alkenyl group | oleyl 3PO adduct | hydrogen (H) |
| (D-18) C18 alkenyl group | hydrogen (H) | hydrogen (H) |
| (D-19) C18 alkenyl group | monoethylammonium | monoethylammonium |
| (D-20) C18-24 alkenyl group | Ammonium | ammonium |
| (D-21) C18-24 alkenyl group | Triethylammonium | hydrogen (H) |
| (D-22) C18-24 alkenyl group | C12 alkylammonium | hydrogen (H) |
| (D-23) C18-24 alkenyl group | isotridecylalkyl group | hydrogen (H) |
| (CM-1) C4 alkenyl group | hydrogen (H) | hydrogen (H) |
| (CM-2) C6 alkenyl group | ammonium | ammonium |
| (CM-3) C26 alkenyl group | hydrogen (H) | hydrogen (H) |
| (CM-4) C30 alkenyl group | isostearyl group | hydrogen (H) |

Example 1

As shown in Table 4, the following ingredients were mixed together. Ninety parts by mass of the silver-coated copper powder (A-101) shown in Table 1 as a silver-coated powder (A-1), was mixed as an electroconductive powder (A) with 10 parts by mass of the epoxy resin (B-11) and epoxy resin (B-12) shown as epoxy resins (B-1) shown in Table 2 as a thermosetting ingredient (B), in a (B-11)/(B-12) mass ratio of 30/70, and with 0.5 parts by mass of the hardener (C-1) shown in Table 2 as a hardener (C). Thereto was added 0.500 parts by mass of the compound (D-01) shown in Table 3, as an alkyl/alkenylsuccinic acid compound (D). The resultant mixture was kneaded with a three-roll mill. Thereafter, butyldiglycol acetate was added as a solvent (E) thereto to regulate the viscosity to 100 Pa·s (1 rpm). Thus, an electroconductive paste composition of Example 1 was produced.

The electroconductive paste composition obtained was evaluated for conductor resistance, reliability (moisture resistance), and storage stability (conductor resistance and viscosity) in the manners described above. This electroconductive paste composition was used to produce solar cells and a solar cell module in the manners described above, and the solar cells were evaluated for cell characteristics. The results thereof are shown in Table 4.

Examples 2 to 4

Electroconductive paste compositions of Examples 2 to 4 were produced in the same manner as in Example 1, except that ingredients were mixed as shown in Table 4. Specifically, a silver-coated powder (A-1) shown in Table 1 and the spherical silver powder (A-01) shown in Table 1 as a silver powder (A-0) were used in combination in a given proportion as an electroconductive powder (A), and thermosetting ingredients (B) shown in Table 2, a hardener (C) shown in Table 2, and an alkyl/alkenylsuccinic acid compound (D) shown in Table 3 were incorporated or added in given amounts.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 4.

TABLE 4

| | Makeup and amounts [parts by mass] | | | |
|---|---|---|---|---|
| Ingredients, Conditions, and Results | Example 1 | Example 2 | Example 3 | Example 4 |
| (A) Electroconductive powder | — | A-01 | A-01 | A-01 |
| | — | 90 | 70 | 50 |
| | A-101 | A-102 | A-103 | A-104 |
| | 100 | 10 | 30 | 50 |
| (B) Thermosetting ingredient | B-11 | B-11 | B-11 | B-11 |
| | 30 | 30 | 30 | 30 |
| | B-12 | B-12 | B-12 | B-12 |
| | 70 | 70 | 70 | 70 |
| (C) Hardener | C-1 | C-2 | C-1 | C-2 |
| (A)/(B) mass ratio | 93/7 | 93/7 | 94/6 | 94/6 |

TABLE 4-continued

| Ingredients, Conditions, and Results | | Makeup and amounts [parts by mass] | | | |
|---|---|---|---|---|---|
| | | Example 1 | Example 2 | Example 3 | Example 4 |
| (D) Alkyl/alkenylsuccinic acid compound | | D-01 | D-02 | D-03 | D-04 |
| | | 0.500 | 1.000 | 0.300 | 1.000 |
| Conductor resistance [μΩ · cm] | | 17 | 9 | 9 | 11 |
| Moisture resistance, relative value | | 120 | 110 | 115 | 110 |
| Storage stability | Conductor resistance [μΩ · cm] | 19 | 10 | 9 | 11 |
| | Viscosity | ○ | ○ | ○ | ○ |
| Solar cell characteristics | Cell characteristics, relative value | 99.0 | 100.0 | 100.2 | 99.7 |
| | Moisture resistance, relative value | 93.3 | 96.0 | 94.3 | 96.0 |

Examples 5 to 14

Electroconductive paste compositions of Examples 5 to 14 were produced in the same manner as in Example 1, except that ingredients were mixed as shown in Table 5 or 6. Specifically, electroconductive powders (A) shown in Table 1, thermosetting ingredients (B) shown in Table 2, a hardener (C) shown in Table 2, and an alkyl/alkenylsuccinic acid compound (D) shown in Table 3 were incorporated or added in given amounts.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 5 or Table 6.

TABLE 5

| Ingredients, Conditions, and Results | | Makeup and amounts [parts by mass] | | | | |
|---|---|---|---|---|---|---|
| | | Example 5 | Example 6 | Example 7 | Example 8 | Example 9 |
| (A) Electroconductive powder | | A-02 | A-01 | A-01 | A-01 | A-01 |
| | | 50 | 50 | 50 | 50 | 50 |
| | | A-101 | A-102 | A-103 | A-104 | A-105 |
| | | 50 | 50 | 50 | 50 | 50 |
| (B) Thermosetting ingredient | | B-11 | B-11 | B-11 | B-11 | B-11 |
| | | 70 | 70 | 70 | 70 | 70 |
| | | B-12 | B-21 | B-12 | B-21 | B-12 |
| | | 30 | 30 | 30 | 30 | 30 |
| (C) Hardener | | C-1 | C-2 | C-1 | C-2 | C-1 |
| (A)/(B) mass ratio | | 94/6 | 94/6 | 94/6 | 94/6 | 94/6 |
| (D) Alkyl/alkenylsuccinic acid compound | | D-05 | D-06 | D-07 | D-08 | D-09 |
| | | 0.100 | 0.200 | 0.500 | 1.000 | 1.500 |
| Conductor resistance [μΩ · cm] | | 10 | 10 | 10 | 10 | 12 |
| Moisture resistance, relative value | | 110 | 110 | 105 | 100 | 100 |
| Storage stability | Conductor resistance [μΩ · cm] | 11 | 11 | 10 | 10 | 12 |
| | Viscosity | ○ | ○ | ○ | ○ | ○ |
| Solar cell characteristics | Cell characteristics, relative value | 100.4 | 100.0 | 99.9 | 99.8 | 99.0 |
| | Moisture resistance, relative value | 95.3 | 95.4 | 96.7 | 98.1 | 98.3 |

TABLE 6

| Ingredients, Conditions, and Results | Makeup and amounts [parts by mass] | | | | |
|---|---|---|---|---|---|
| | Example 10 | Example 11 | Example 12 | Example 13 | Example 14 |
| (A) Electroconductive powder | A-01 | A-01 | A-01 | A-01 | A-01 |
| | 30 | 30 | 30 | 30 | 30 |
| | A-02 | A-02 | A-02 | A-02 | A-02 |
| | 30 | 30 | 30 | 30 | 30 |
| | A-12 | A-13 | A-14 | A-21 | A-22 |
| | 40 | 40 | 40 | 40 | 40 |
| (B) Thermosetting ingredient | B-11 | B-11 | B-11 | B-11 | B-11 |
| | 85 | 85 | 85 | 85 | 85 |
| | B-21 | B-12 | B-21 | B-12 | B-21 |
| | 15 | 15 | 15 | 15 | 15 |

TABLE 6-continued

| Ingredients, Conditions, and Results | | Makeup and amounts [parts by mass] | | | | |
|---|---|---|---|---|---|---|
| | | Example 10 | Example 11 | Example 12 | Example 13 | Example 14 |
| (C) Hardener | | C-2 | C-1 | C-2 | C-1 | C-2 |
| (A)/(B) mass ratio | | 95/5 | 95/5 | 95/5 | 95/5 | 95/5 |
| (D) Alkyl/alkenylsuccinic acid compound | | D-10 | D-11 | D-12 | D-13 | D-14 |
| | | 0.100 | 0.300 | 0.300 | 0.500 | 0.050 |
| Conductor resistance [μΩ · cm] | | 9 | 12 | 13 | 20 | 22 |
| Moisture resistance, relative value | | 105 | 105 | 100 | 120 | 110 |
| Storage stability | Conductor resistance [μΩ · cm] | 10 | 12 | 13 | 21 | 22 |
| | Viscosity | ○ | ○ | ○ | ○ | ○ |
| Solar cell characteristics | Cell characteristics, relative value | 100.2 | 99.7 | 99.5 | 98.5 | 98.4 |
| | Moisture resistance, relative value | 96.4 | 96.6 | 97.7 | 93.3 | 95.3 |

Examples 15 to 19

Electroconductive paste compositions of Examples 15 to 19 were produced in the same manner as in Example 1, except that ingredients were mixed as shown in Table 7. Specifically, electroconductive powders (A) shown in Table 1, thermosetting ingredients (B) shown in Table 2, a hardener (C) shown in Table 2, and an alkyl/alkenylsuccinic acid compound (D) shown in Table 3 were incorporated or added in given amounts.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 7.

TABLE 7

| Ingredients, Conditions, and Results | | Makeup and amounts [parts by mass] | | | | |
|---|---|---|---|---|---|---|
| | | Example 15 | Example 16 | Example 17 | Example 18 | Example 19 |
| (A) Electroconductive powder | | — | A-01 | A-01 | A-01 | A-01 |
| | | — | 30 | 30 | 30 | 30 |
| | | A-101 | A-102 | A-102 | A-103 | A-102 |
| | | 50 | 70 | 70 | 70 | 70 |
| | | A-105 | — | — | — | — |
| | | 50 | | | | |
| (B) Thermosetting ingredient | | B-11 | B-11 | B-11 | B-11 | B-11 |
| | | 50 | 50 | 50 | 50 | 50 |
| | | B-12 | B-12 | B-12 | B-12 | B-21 |
| | | 50 | 50 | 50 | 50 | 50 |
| (C) Hardener | | C-2 | C-1 | C-2 | C-1 | C-2 |
| (A)/(B) mass ratio | | 94/6 | 95/5 | 95/5 | 95/5 | 95/5 |
| (D) Alkyl/alkenylsuccinic acid compound | | D-15 | D-16 | D-17 | D-18 | D-19 |
| | | 0.200 | 0.200 | 0.500 | 0.100 | 0.300 |
| Conductor resistance [μΩ · cm] | | 14 | 12 | 12 | 12 | 12 |
| Moisture resistance, relative value | | 110 | 110 | 105 | 105 | 100 |
| Storage stability | Conductor resistance [μΩ · cm] | 15 | 12 | 12 | 12 | 12 |
| | Viscosity | ○ | ○ | ○ | ○ | ○ |
| Solar cell characteristics | Cell characteristics, relative value | 99.5 | 99.7 | 99.5 | 99.7 | 99.7 |
| | Moisture resistance, relative value | 95.4 | 95.4 | 96.7 | 96.4 | 97.8 |

Examples 20 to 23

Electroconductive paste compositions of Examples 20 to 23 were produced in the same manner as in Example 1, except that ingredients were mixed as shown in Table 8. Specifically, electroconductive powders (A) shown in Table 1, thermosetting ingredients (B) shown in Table 2, a hardener (C) shown in Table 2, and an alkyl/alkenylsuccinic acid compound (D) shown in Table 3 were incorporated or added in given amounts.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 8.

TABLE 8

| | Makeup and amounts [parts by mass] | | | |
|---|---|---|---|---|
| Ingredients, Conditions, and Results | Example 20 | Example 21 | Example 22 | Example 23 |
| (A) Electroconductive powder | A-01 10 A-102 90 | A-01 10 A-102 90 | A-01 10 A-103 90 | A-01 10 A-103 90 |
| (B) Thermosetting ingredient | B-11 50 B-12 50 | B-11 50 B-22 50 | B-11 50 B-12 50 | B-11 50 B-22 50 |
| (C) Hardener | C-1 | C-2 | C-1 | C-2 |
| (A)/(B) mass ratio | 96/4 | 96/4 | 96/4 | 96/4 |
| (D) Alkyl/alkenylsuccinic acid compound | D-20 0.500 | D-21 1.000 | D-22 0.300 | D-23 1.000 |
| Conductor resistance [μΩ · cm] | 14 | 13 | 13 | 14 |
| Moisture resistance, relative value | 110 | 110 | 105 | 105 |
| Storage stability — Conductor resistance [μΩ · cm] | 15 | 14 | 13 | 13 |
| Storage stability — Viscosity | ○ | ○ | ○ | ○ |
| Solar cell characteristics — Cell characteristics, relative value | 99.4 | 99.6 | 99.5 | 99.2 |
| Solar cell characteristics — Moisture resistance, relative value | 95.3 | 95.4 | 96.7 | 97.3 |

Reference Example 1

An electroconductive paste composition of Reference Example 1 was produced in the same manner as in Example 1, except that a silver powder (A-0) (spherical silver powder (A-01) shown in Table 1) was used alone as an electroconductive powder (A) and stearic acid was used as a comparative compound without using the alkyl/alkenylsuccinic acid compound (D), as shown in Table 9.

The electroconductive paste composition obtained was evaluated for conductor resistance, reliability (moisture resistance), and storage stability (conductor resistance and viscosity) in the manners described above. This electroconductive paste composition was used to produce solar cells and a solar cell module in the manners described above, and the solar cells were evaluated for cell characteristics. The results thereof are shown in Table 9.

Comparative Example 1

An electroconductive paste composition of Comparative Example 1 was produced in the same manner as in Example 5 (see Table 5), except that the alkyl/alkenylsuccinic acid compound (D) was not used, as shown in Table 9.

The electroconductive paste composition obtained was evaluated for conductor resistance, reliability (moisture resistance), and storage stability (conductor resistance and viscosity) in the manners described above. This electroconductive paste composition was used to produce solar cells and a solar cell module in the manners described above, and the solar cells were evaluated for cell characteristics. The results thereof are shown in Table 9.

Reference Example 2

An electroconductive paste composition of Reference Example 2 was produced in the same manner as in Example 1, except that a silver powder (A-0) (spherical silver powder (A-01) shown in Table 1) was used alone as an electroconductive powder (A) and that the compound (D-05) shown in Table 3 was used as an alkyl/alkenylsuccinic acid compound (D) in an amount of 0.200 parts by mass, as shown in Table 9.

The electroconductive paste composition obtained was evaluated for conductor resistance, reliability (moisture resistance), and storage stability (conductor resistance and viscosity) in the manners described above. This electroconductive paste composition was used to produce solar cells and a solar cell module in the manners described above, and the solar cells were evaluated for cell characteristics. The results thereof are shown in Table 9.

Comparative Examples 2 and 3

Electroconductive paste compositions of Comparative Examples 2 and 3 were produced in the same manner as in Example 5 (see Table 5), except that the compound (D-05) shown in Table 3 was used as an alkyl/alkenylsuccinic acid compound (D) in too large an amount (2.000 parts by mass; Comparative Example 2) or in too small an amount (0.005 parts by mass; Comparative Example 3), as shown in Table 9.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 9.

TABLE 9

| Ingredients, Conditions, and Results | | Makeup and amounts [parts by mass] | | | | |
|---|---|---|---|---|---|---|
| | | Reference Example 1 | Comparative Example 1 | Reference Example 2 | Comparative Example 2 | Comparative Example 3 |
| (A) Electroconductive powder | | A-01 | A-02 | A-01 | A-02 | A-02 |
| | | 100 | 50 | 100 | 50 | 50 |
| | | — | A-101 | — | A-101 | A-101 |
| | | — | 50 | — | 50 | 50 |
| (B) Thermosetting ingredient | | B-11 | B-11 | B-11 | B-11 | B-11 |
| | | 70 | 70 | 70 | 70 | 70 |
| | | B-12 | B-12 | B-12 | B-12 | B-12 |
| | | 30 | 30 | 30 | 30 | 30 |
| (C) Hardener | | C-1 | C-1 | C-1 | C-1 | C-1 |
| (A)/(B) mass ratio | | 93/7 | 94/6 | 93/7 | 94/6 | 94/6 |
| (D) Alkyl/alkenylsuccinic acid compound or comparative compound | | stearic acid | — | D-05 | D-05 | D-05 |
| | | 0.200 | — | 0.200 | 2.000 | 0.005 |
| Conductor resistance [µΩ · cm] | | 10 | 33 | 9 | 18 | 22 |
| Moisture resistance, relative value | | 100 | 230 | 100 | 100 | 180 |
| Storage stability | Conductor resistance [µΩ · cm] | 10 | 50 | 9 | 18 | 52 |
| | Viscosity | ○ | x | ○ | ○ | x |
| Solar cell characteristics | Cell characteristics, relative value | 100.0 | 93.8 | 100.3 | 97.0 | 95.0 |
| | Moisture resistance, relative value | 97.1 | 67.1 | 98.8 | 95.4 | 80.1 |

Comparative Examples 4 to 8

Electroconductive paste compositions of Comparative Examples 4 to 8 were produced in the same manner as in Reference Example 1 (see Table 9), except that ingredients were mixed as shown in Table 10. Specifically, one or two electroconductive powders (A) shown in Table 1, thermosetting ingredients (B) shown in Table 2, a hardener (C) shown in Table 2, and stearic acid or stearylamine as a comparative compound in place of an alkyl/alkenylsuccinic acid compound (D) were incorporated or added in given amounts.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 10.

TABLE 10

| Ingredients, Conditions, and Results | | Makeup and amounts [parts by mass] | | | | |
|---|---|---|---|---|---|---|
| | | Comparative Example 4 | Comparative Example 5 | Comparative Example 6 | Comparative Example 7 | Comparative Example 8 |
| (A) Electroconductive powder | | — | A-02 | A-02 | — | A-02 |
| | | — | 50 | 50 | — | 50 |
| | | A-101 | A-101 | A-21 | A-101 | A-101 |
| | | 100 | 50 | 50 | 100 | 50 |
| (B) Thermosetting ingredient | | B-11 | B-11 | B-11 | B-11 | B-11 |
| | | 30 | 70 | 85 | 30 | 70 |
| | | B-12 | B-12 | B-12 | B-12 | B-12 |
| | | 70 | 30 | 15 | 70 | 30 |
| (C) Hardener | | C-1 | C-1 | C-1 | C-1 | C-1 |
| (A)/(B) mass ratio | | 93/7 | 94/6 | 94/6 | 93/7 | 94/6 |
| Comparative compound | | stearic acid | stearic acid | stearic acid | stearylamine | stearylamine |
| | | 0.200 | 0.200 | 0.200 | 0.200 | 0.200 |
| Conductor resistance [µΩ · cm] | | 36 | 25 | 60 | 42 | 30 |
| Moisture resistance, relative value | | 250 | 170 | 290 | 300 | 200 |
| Storage stability | Conductor resistance [µΩ · cm] | 50 | 45 | 130 | 82 | 45 |
| | Viscosity | x | x | x | x | x |

TABLE 10-continued

| | | Makeup and amounts [parts by mass] | | | | |
|---|---|---|---|---|---|---|
| Ingredients, Conditions, and Results | | Comparative Example 4 | Comparative Example 5 | Comparative Example 6 | Comparative Example 7 | Comparative Example 8 |
| Solar cell characteristics | Cell characteristics, relative value | 93.5 | 95.8 | 87.5 | 91.5 | 94.5 |
| | Moisture resistance, relative value | 62.4 | 81.1 | 53.0 | 55.7 | 74.1 |

Comparative Examples 9 to 12

Electroconductive paste compositions of Comparative Examples 9 to 12 were produced in the same manner as in Reference Example 2 (see Table 9), except that any of the comparative compounds (CM-1) to (CM-4) shown in Table 3 was used in place of the alkyl/alkenylsuccinic acid compound (D) shown in Table 3, as shown in Table 11.

The electroconductive paste compositions obtained were each evaluated for conductor resistance, reliability (moisture resistance), and storage stability (conductor resistance and viscosity) in the manners described above. These electroconductive paste compositions were each used to produce solar cells and a solar cell module in the manners described above, and the solar cells were evaluated for cell characteristics. The results thereof are shown in Table 11.

TABLE 11

| | | Makeup and amounts [parts by mass] | | | |
|---|---|---|---|---|---|
| Ingredients, Conditions, and Results | | Comparative Example 9 | Comparative Example 10 | Comparative Example 11 | Comparative Example 12 |
| (A) Electroconductive powder | | A-02 | A-02 | A-02 | A-02 |
| | | 50 | 50 | 50 | 50 |
| | | A-101 | A-101 | A-101 | A-101 |
| | | 50 | 50 | 50 | 50 |
| (B) Thermosetting ingredient | | B-11 | B-11 | B-11 | B-11 |
| | | 70 | 70 | 70 | 70 |
| | | B-12 | B-12 | B-12 | B-12 |
| | | 30 | 30 | 30 | 30 |
| (C) Hardener | | hardener 1 | hardener 1 | hardener 1 | hardener 1 |
| (A)/(B) mass ratio | | 94/6 | 94/6 | 94/6 | 94/6 |
| Comparative compound | | CM-1 | CM-2 | CM-3 | CM-4 |
| | | 0.500 | 0.500 | 0.500 | 0.500 |
| Conductor resistance [µΩ · cm] | | 20 | 18 | 11 | 11 |
| Moisture resistance, relative value | | 200 | 170 | 105 | 105 |
| Storage stability | Conductor resistance [µΩ · cm] | 45 | 30 | 12 | 12 |
| | Viscosity | x | Δ | Δ | x |
| Solar cell characteristics | Cell characteristics, relative value | 97.5 | 98.0 | 99.8 | 99.8 |
| | Moisture resistance, relative value | 75.0 | 82.8 | 97.0 | 98.1 |

(Comparison Among the Examples, Comparative Examples, and Reference Examples)

As apparent from the results of Examples 1 to 23 and Reference Examples 1 and 2, the following can be seen. A thermosetting electroconductive paste composition including a silver-coated powder (A-1) and/or a copper-based powder (A-2) as an electroconductive powder (A) and an epoxy resin (B-1) and/or a blocked polyisocyanate compound (B-2) as a thermosetting ingredient (B) can be made to attain satisfactory properties and to give solar cells having satisfactory properties as in the case of using a silver powder (A-0) as the only electroconductive powder (A), by incorporating thereinto an alkyl/alkenylsuccinic acid compound (D) in an amount within the given range.

In contrast, in the case where a silver-coated powder (A-1) and/or a copper-based powder (A-2) is used as an electroconductive powder (A) and an epoxy resin (B-1) and/or a blocked polyisocyanate compound (B-2) is used as a thermosetting ingredient (B) but no alkyl/alkenylsuccinic acid compound (D) is used, then the composition neither attains satisfactory properties nor gives solar cells having sufficient properties, as apparent from the results of Comparative Examples 1 to 12.

It can also be seen that in the case where an alkyl/alkenylsuccinic acid compound (D) is used but is incorporated in an amount outside the given range, the composition does not attain satisfactory properties or gives solar cells having insufficient properties. Furthermore, it can be seen that in the case where the alkyl or alkenyl group introduced into the α-position carbon atom of the alkyl/alkenylsuccinic acid compound (D) has less than 8 or more than 24 carbon atoms, the composition does not attain satisfactory properties or gives solar cells having insufficient properties.

As described above, the thermosetting electroconductive paste composition according to this disclosure contains at least a silver-coated powder (A-1) and/or a copper-based powder (A-2) as an electroconductive powder (A), contains an epoxy resin (B-1) and/or a blocked polyisocyanate compound (B-2) as a thermosetting ingredient (B), further contains a hardener (C), and still further contains an alkyl/alkenylsuccinic acid compound (D) as an additive in an amount within a given range.

Due to this configuration, the electroconductive paste composition in which the electroconductive powder (A) includes a silver-coated powder (A-1) or a copper-based powder (A-2) can give hardened films having satisfactory electroconductivity, heat resistance, and moisture resistance and can have satisfactory storage stability, even in cases where a silver powder (A-0) is used therein in a relatively reduced amount. Furthermore, application of the thermosetting electroconductive paste composition according to this disclosure to solar cells makes it possible to impart satisfactory reliability to the solar cells.

The present invention is not limited to the embodiments described above and can be variously modified within the scope of the claims. Any embodiment obtained by suitably combining two or more of the technical means disclosed in different embodiments or in modification examples is included in the technical range of the present invention.

INDUSTRIAL APPLICABILITY

The present invention is suitable for use in the field of production of various electronic appliances or electronic components. In particular, the present invention is extensively suitable for use in forming the conductor electrodes of solar cells, the internal electrodes or external electrodes of chip type electronic components, electrodes, wiring, etc. for RFIDs, electromagnetic shields, oscillators, membrane switches, tough panels, components for use in electroluminescence, etc. or in forming higher-precision electrodes, wiring, etc., and in fields where bonding of electronic components is required.

While the present invention has been described in detail and with reference to specific embodiments thereof, it will be apparent to one skilled in the art that various changes and modifications can be made therein without departing from the spirit and scope thereof.

This application is based on Japanese Patent Application No. 2017-131354 filed on Jul. 4, 2017, the entire subject matter of which is incorporated herein by reference.

DESCRIPTION OF THE REFERENCE NUMERALS AND SIGNS

10 Solar cell
11 n-Type single-crystal silicon substrate
12 i-Type amorphous silicon layer
13 p-Type amorphous silicon layer
14 Transparent electroconductive film
15 Collector electrode
16 i-Type amorphous silicon layer
17 n-Type amorphous silicon layer
18 Transparent electroconductive film
19 Collector electrode
20 Solar cell module
21 Tab
22 Filling material
23 Front-surface protection glass
24 Back-surface protection material
50 Conductor pattern for evaluation
51a Terminal
51b Terminal
52 Wiring part

The invention claimed is:

1. A thermosetting electroconductive paste composition comprising:
an electroconductive powder (A) containing at least one of a silver-coated metal powder (A-1) and a powder of either copper or an alloy thereof (A-2);
a thermosetting ingredient (B) containing at least one of an epoxy resin (B-1) and a blocked polyisocyanate compound (B-2);
a hardener (C); and
an alkyl- or alkenylsuccinic acid compound (D) which is a succinic acid or derivative thereof having an alkyl or alkenyl group having a carbon number of from 8 to 24 introduced into an α-position,
wherein an amount of the alkyl- or alkenylsuccinic acid compound is 0.01 to 1.8 parts by mass per 100 parts by mass of a sum of the electroconductive powder (A) and the thermosetting ingredient (B).

2. The thermosetting electroconductive paste composition according to claim 1,
wherein the alkyl- or alkenylsuccinic acid compound (D) is represented by the following formula (1):

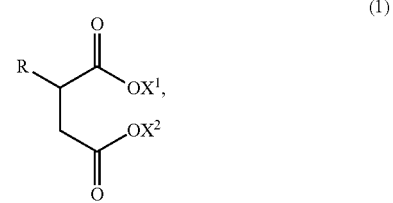

in the formula, R is an alkyl or alkenyl group having a carbon number of from 8 to 24, $X^1$ and $X^2$ each independently are a monovalent cation, an alkyl or alkenyl group having a carbon number of from 1 to 18, or an alkylene glycol adduct of an alkyl or alkenyl group having a carbon number of from 1 to 18, and the alkyl or alkenyl group in the R, $X^1$, or $X^2$ is linear or branched.

3. The thermosetting electroconductive paste composition according to claim 1,
wherein the silver-coated metal powder (A-1) is at least one powder selected from the group consisting of a silver-coated copper powder, a silver-coated copper alloy powder, a silver-coated nickel powder, and a silver-coated aluminum powder.

4. The thermosetting electroconductive paste composition according to claim 1,
wherein the electroconductive powder (A) further contains a silver powder (A-0), and
when W1 is a total mass of the at least one of the silver-coated metal powder (A-1) and the powder of either copper or an alloy thereof (A-2) and W2 is a mass of the silver powder (A-0), a mass ratio W1/W2 in the conductive powder (A) is from 100/0 to 1/99.

5. The thermosetting electroconductive paste composition according to claim 1,
   wherein the electroconductive powder (A) further contains at least one powder selected from the group consisting of a gold powder, a palladium powder, a nickel powder, an aluminum powder, a lead powder, and a carbon powder (A-3).

6. A solar cell comprising a collector electrode formed from the thermosetting electroconductive paste composition according to claim 1.

7. The solar cell according to claim 6 comprising a transparent electroconductive film as a layer which underlies the collector electrode.

8. A solar cell module comprising the solar cell according to claim 6.

* * * * *